US011988707B2

(12) United States Patent
Ray et al.

(10) Patent No.: US 11,988,707 B2
(45) Date of Patent: May 21, 2024

(54) SENSOR STATUS DETERMINATION BASED ON INDEPENDENT FUNDAMENTAL FREQUENCY MEASUREMENTS

(71) Applicant: Schlumberger Technology Corporation, Sugar Land, TX (US)

(72) Inventors: Keith Ray, Houston, TX (US); David Conn, Katy, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 207 days.

(21) Appl. No.: 17/755,238

(22) PCT Filed: Oct. 26, 2020

(86) PCT No.: PCT/US2020/070694
§ 371 (c)(1),
(2) Date: Apr. 25, 2022

(87) PCT Pub. No.: WO2021/081561
PCT Pub. Date: Apr. 29, 2021

(65) Prior Publication Data
US 2022/0373591 A1 Nov. 24, 2022

Related U.S. Application Data

(60) Provisional application No. 62/925,709, filed on Oct. 24, 2019.

(51) Int. Cl.
G01R 31/28 (2006.01)
G01D 3/08 (2006.01)
(52) U.S. Cl.
CPC ........... G01R 31/2829 (2013.01); G01D 3/08 (2013.01)

(58) Field of Classification Search
CPC .............................. G01R 31/2829; G01D 3/08
See application file for complete search history.

(56) References Cited

U.S. PATENT DOCUMENTS 8,380,438 B2 * 2/2013 Jarrot ...................... E21B 47/18
702/9
9,702,742 B2 * 7/2017 Reimann ................ G01D 21/00
(Continued)

FOREIGN PATENT DOCUMENTS

WO 2018128763 A1 7/2018

OTHER PUBLICATIONS

Search Report and Written Opinion of International Patent Application No. PCT/US2020/070694 dated Mar. 23, 2021, 10 pages.
(Continued)

Primary Examiner — Walter L Lindsay, Jr.
Assistant Examiner — Milton Gonzalez
(74) Attorney, Agent, or Firm — Jeffrey D. Frantz

(57) ABSTRACT

Methods, computing systems, and computer-readable media for detecting sensor malfunctioning status. The method includes receiving sensor measurements of a first type from a first type of sensor, deriving a first value for a metric from the sensor measurements of the first type, receiving sensor measurements of a second type from a second type of sensor, wherein the second measurements of the second type include a second value for the metric, comparing the first value to the second value, determining whether the first type of sensor or the second type of sensor is malfunctioning based on the comparing, and storing or outputting information indicating whether first type of sensor and the second type of sensor are malfunctioning.

20 Claims, 7 Drawing Sheets

(56) References Cited

U.S. PATENT DOCUMENTS

| | | |
|---|---|---|
| 2002/0148644 A1 | 10/2002 | Schultz et al. |
| 2006/0021450 A1 | 2/2006 | Nallapa |
| 2012/0285744 A1 | 11/2012 | Bernard |
| 2015/0233231 A1 | 8/2015 | Rodney et al. |
| 2015/0233730 A1 | 8/2015 | Guillet et al. |

OTHER PUBLICATIONS

Extended Search Report issued in European Patent Application No. 20879827.2 dated Oct. 19, 2023, 8 pages.

\* cited by examiner

SENSOR STATUS DETERMINATION BASED ON INDEPENDENT FUNDAMENTAL FREQUENCY MEASUREMENTS

CROSS-REFERENCE TO RELATED APPLICATIONS

This application is a National Stage Entry and claims benefit of PCT Patent Application No. PCT/US2020/070694, filed on Oct. 26, 2020, which claims priority to U.S. Provisional Patent Application having Ser. No. 62/925,709, which was filed on Oct. 24, 2019, and is incorporated herein by reference in its entirety.

BACKGROUND

A surface data acquisition system for oil/gas drilling may include a variety of sensors to monitor drilling equipment status, surface conditions, etc. Some sensors may include equipment motor sensors, load sensors, pressure sensors, temperature sensors, environmental sensors, etc. Sensors used in the field may lack self-diagnostics, as it may be cost-prohibitive for every sensor to include such features.

SUMMARY

Embodiments of the disclosure may provide a method for detecting sensor malfunctioning status. The method includes receiving sensor measurements of a first type from a first type of sensor, deriving a first value for a metric from the sensor measurements of the first type, receiving sensor measurements of a second type from a second type of sensor, wherein the second measurements of the second type include a second value for the metric, comparing the first value to the second value, determining whether the first type of sensor or the second type of sensor is malfunctioning based on the comparing, and storing or outputting information indicating whether first type of sensor and the second type of sensor are malfunctioning.

Embodiments of the disclosure may also provide a computing system, including one or more processors; and a memory system comprising one or more non-transitory computer-readable media storing instructions that, when executed by at least one of the one or more processors, cause the computing system to perform operations. The operations may include receiving sensor measurements of a first type from a first type of sensor, deriving a first value for a metric from the sensor measurements of the first type, receiving sensor measurements of a second type from a second type of sensor, wherein the second measurements of the second type include a second value for the metric, comparing the first value to the second value, determining whether the first type of sensor or the second type of sensor is malfunctioning based on the comparing, and storing or outputting information indicating whether first type of sensor and the second type of sensor are malfunctioning.

Embodiments of the disclosure may further provide a non-transitory computer-readable medium storing instructions that, when executed by one or more processors of a computing system, cause the computing system to perform operations. The operations may include receiving sensor measurements of a first type from a first type of sensor, deriving a first value for a metric from the sensor measurements of the first type, receiving sensor measurements of a second type from a second type of sensor, wherein the second measurements of the second type include a second value for the metric, comparing the first value to the second value, determining whether the first type of sensor or the second type of sensor is malfunctioning based on the comparing, and storing or outputting information indicating whether the first type of sensor and the second type of sensor are malfunctioning.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Figure 1:
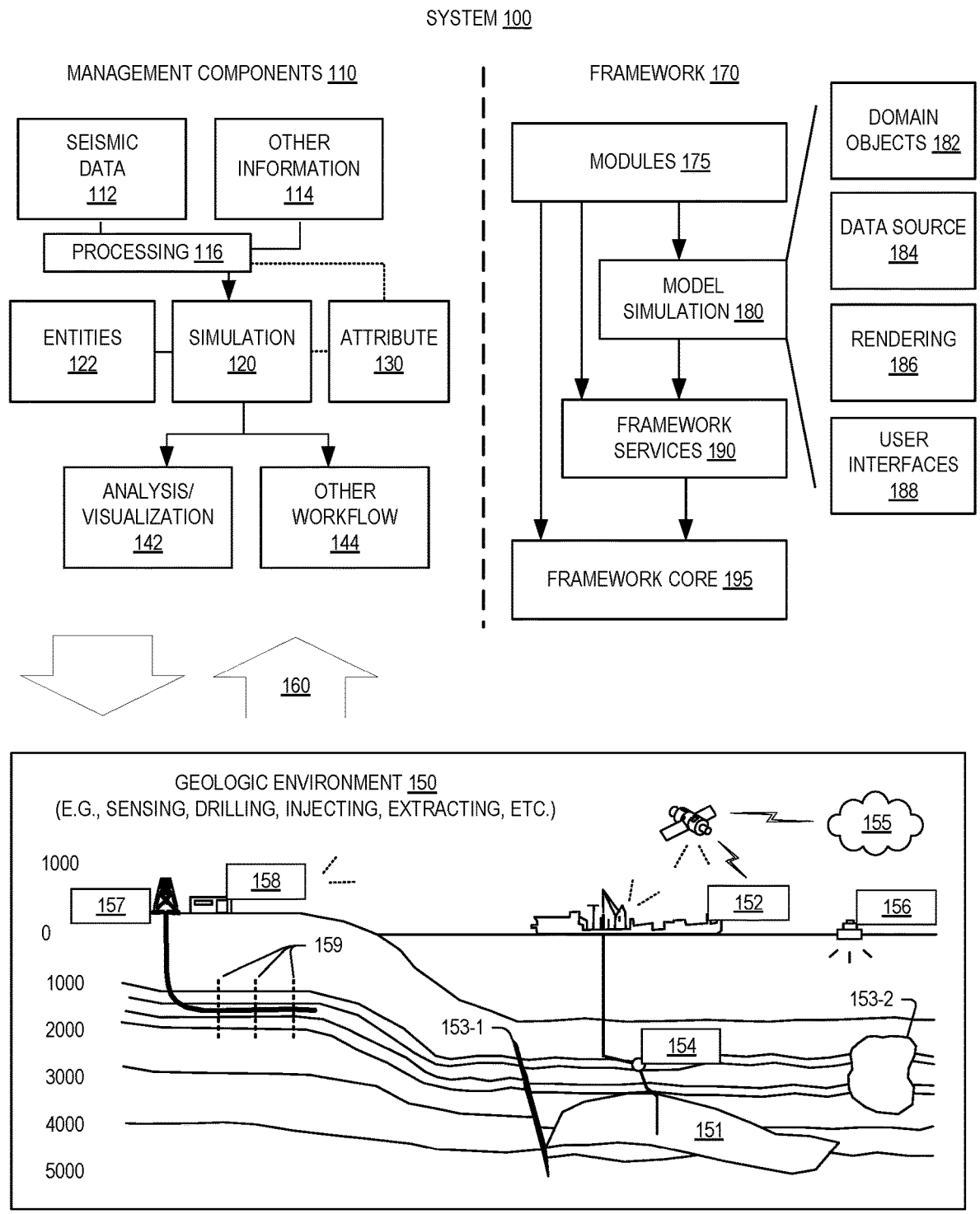
FIG. 1 illustrates an example of a system that includes various management components to manage various aspects of a geologic environment, according to an embodiment.

Sensor failure for equipment used in an oil/gas environment (or other type of environment) may occur without notification, potentially causing data integrity loss. Depending upon field activity, it may not be immediately apparent that a sensor has failed or is not properly connected. Further, in some cases, intermitted data loss can occur, but may be difficult to recognize. Accordingly, aspects of the present disclosure may include a system and/or method that automates the detection of sensor failure for sensors even those that are not equipped with self-diagnostic features. For example, independent data measurements from two different sensors with independent functions may be analyzed to verify the functionality of both sensors.

As one illustrative example, sensor measurements from a standpipe pressure sensor may be used to verify the working functionality of a pump stroke sensor, and vice versa. More specifically, an equipment's fundamental frequency may be derived (e.g., calculated, modeled, interpolated, and/or estimated) from the standpipe pressure sensor. As an example, the fundamental frequency of a crankshaft driving mud pump pistons or plungers may be derived. This fundamental frequency may be compared with the fundamental frequency reported by a pump stroke sensor. If the two values agree (e.g., to within a threshold value), the operation of both sensors may be verified. If the two values do not agree, the systems and/or methods, described herein, may determine that one or both sensors are malfunctioning, and provide an alert to notify an operator of the malfunction. Further, aspects of the present disclosure may include a technique to determine which sensors are failing and provide a notification of the failing sensors. That is, functionality of two different types of sensors may be verified by analyzing two different types of measurements from the two different types of sensors. In the example described herein, measurements from a pressure sensor (e.g., standpipe pressure sensor) may be used to verify the functionality of a pump stroke sensor, even though the pressure sensor does not itself take the same measurements as the pump stroke sensor (and vice versa). In this way, sensor functionality may be verified automatically during the normal course of operation of the sensors. That is, no additional testing procedures or testing equipment is needed to test sensor functionality. Further, sensor functionality may be automated by analyzing existing sensor readings for mismatches between a metric reported or derived from one type of sensor with the same metric reported or derived from another type of sensor.

The systems and/or methods may automate sensor malfunction reporting to reduce instances in which malfunctioning sensors are used in real-time operations, and to reduce the downtime from diagnosing and replacing malfunction sensors. In the case of downhole telemetry systems, a validated, accurate pump stroke frequency may enhance mud pump noise cancellation in the telemetry signal, improve survey quality, and reduce bad data from false telemetry signal detection. Other benefits may be realized as a result of validating the functionality of any type of sensors in any time of field environment.

Reference will now be made in detail to embodiments, examples of which are illustrated in the accompanying drawings and figures. In the following detailed description, numerous specific details are set forth in order to provide a thorough understanding of the invention. However, it will be apparent to one of ordinary skill in the art that the invention may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the present disclosure. The first object or step, and the second object or step, are both, objects or steps, respectively, but they are not to be considered the same object or step.

The terminology used in the description herein is for the purpose of describing particular embodiments and is not intended to be limiting. As used in this description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Washington), which provides a set of extensible object classes. In the .NET® framework, an object class encapsulates a module of reusable code and associated data structures. Object classes can be used to instantiate object instances for use in a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Texas), the INTERSECT™ reservoir simulator (Schlumberger Limited, Houston Texas), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Texas). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Texas) allows for integration of add-ons (or plug-ins) into a PETREL® framework workflow. The OCEAN® framework environment leverages .NET® tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or instead include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

Figure 2:
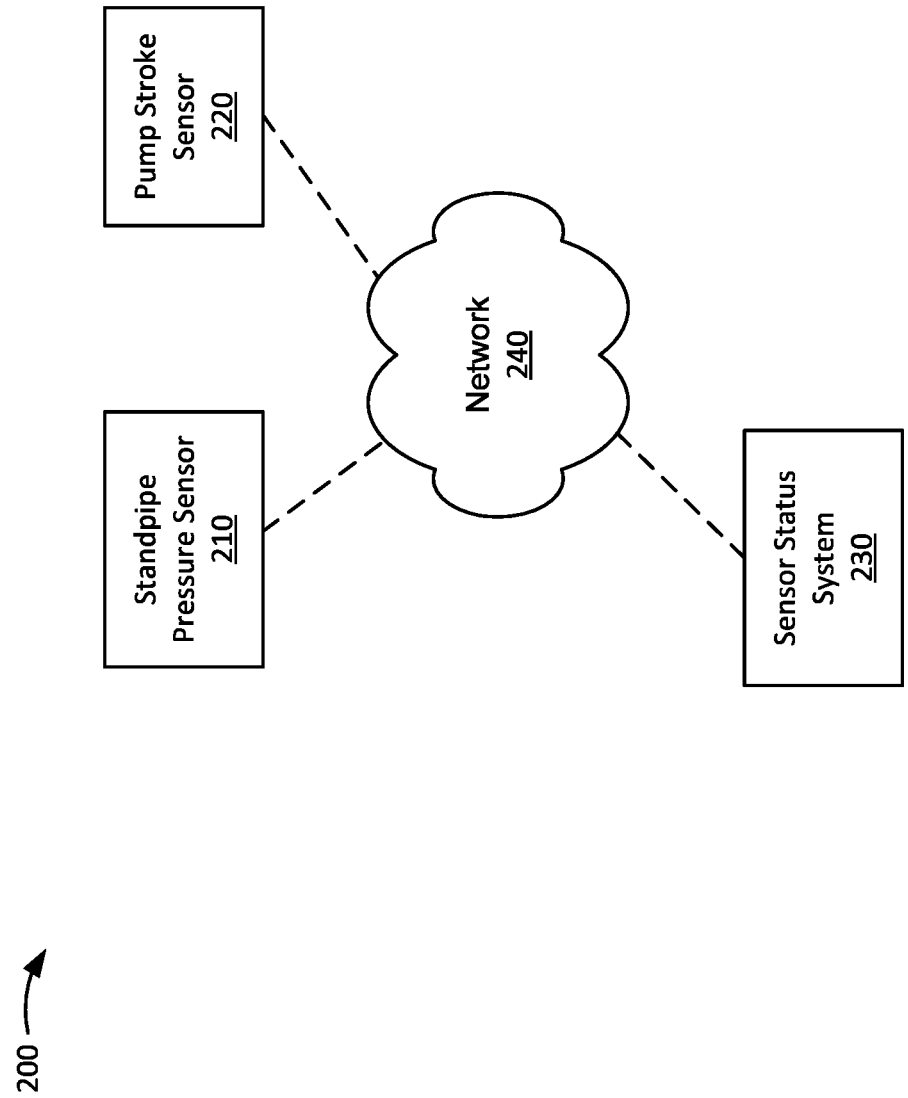
FIG. 2 illustrates an example sensor status environment in accordance with aspects of the present disclosure.

FIG. 2 illustrates an example sensor status environment in accordance with aspects of the present disclosure. As shown in FIG. 2, the sensor status environment 200 includes a standpipe pressure sensor 210, a pump stroke sensor 220, a sensor status system 230, and a network 240. In some embodiments, one or more of the components in the sensor status environment 200 of FIG. 2 may correspond to one or more of the components in the geological environment 150 of FIG. 1.

The standpipe pressure sensor 210 may include a pressure sensor and/or gauge that may be provided in a standpipe. In some embodiments, the standpipe pressure sensor 210 may provide standpipe pressure measurements to the sensor status system 230.

The pump stroke sensor 220 may be provided in oil field equipment, such as a mud pump or other type of equipment. In some embodiments, the pump stroke sensor 220 may count strokes performed by the equipment as the equipment operates (e.g., for each pump cycle performed by the mud pump). The pump stroke sensor 220 may provide data representing the pump stroke counts and pump stroke frequency to the sensor status system 230.

The sensor status system 230 may include one or more computing devices that execute one or more processes for determining the operating status of different types of sensors based on independent sensor measurements. In the example described herein, the sensor status system 230 may determine the operating status of the standpipe pressure sensor 210 and/or the pump stroke sensor 220, although in practice, the sensor status system 230 may determine the operating status of any variety of types of sensors. In some embodiments, the sensor status system 230 may receive sensor measurements from the standpipe pressure sensor 210, calculate or derive a fundamental frequency of equipment (e.g., a crank shaft driving mud pump pistons) based on sensor measurements, receive a fundamental frequency measurement from the pump stroke sensor 220, and compare the derived fundamental frequency (e.g., derived from the measurements from the standpipe pressure sensor 210) with the reported fundamental frequency (e.g., reported by the pump stroke sensor 220). If the frequencies match (e.g., to within a threshold value), the sensor status system 230 may determine that both the standpipe pressure sensor 210 and pump stroke sensor 220 are functioning properly. If, on the other hand, the fundamental frequencies do not match, the sensor status system 230 may determine that at least one of the standpipe pressure sensor 210 and the pump stroke sensor 220 are malfunctioning and may determine which of the standpipe pressure sensor 210 and/or the pump stroke sensor 220 are malfunctioning. The sensor status system 230 may store and/or output information regarding the operating status of the standpipe pressure sensor 210 and the pump stroke sensor 220. In some embodiments, the sensor status system 230 may output an alert based on detecting that one or both of the standpipe pressure sensor 210 and the pump stroke sensor 220 are malfunctioning.

The network 240 may include network nodes and one or more wired and/or wireless networks. For example, the network 240 may include a cellular network (e.g., a second generation (2G) network, a third generation (3G) network, a fourth generation (4G) network, a fifth generation (5G) network, a long-term evolution (LTE) network, a global system for mobile (GSM) network, a code division multiple access (CDMA) network, an evolution-data optimized (EVDO) network, or the like), a public land mobile network (PLMN), and/or another network. Additionally, or alternatively, the network 240 may include a local area network (LAN), a wide area network (WAN), a metropolitan network (MAN), the Public Switched Telephone Network (PSTN), an ad hoc network, a managed Internet Protocol (IP) network, a virtual private network (VPN), an intranet, the Internet, a fiber optic-based network, and/or a combination of these or other types of networks. In embodiments, the network 240 may include copper transmission cables, optical transmission fibers, wireless transmission, routers, firewalls, switches, gateway computers and/or edge servers.

The quantity of devices and/or networks in the environment 200 is not limited to what is shown in FIG. 2. In practice, the environment 200 may include additional devices and/or networks; fewer devices and/or networks; different devices and/or networks; or differently arranged devices and/or networks than illustrated in FIG. 2. Also, in some implementations, one or more of the devices of the environment 200 may perform one or more functions described as being performed by another one or more of the devices of the environment 200. Devices of the environment 200 may interconnect via wired connections, wireless connections, or a combination of wired and wireless connections.

Figure 3:
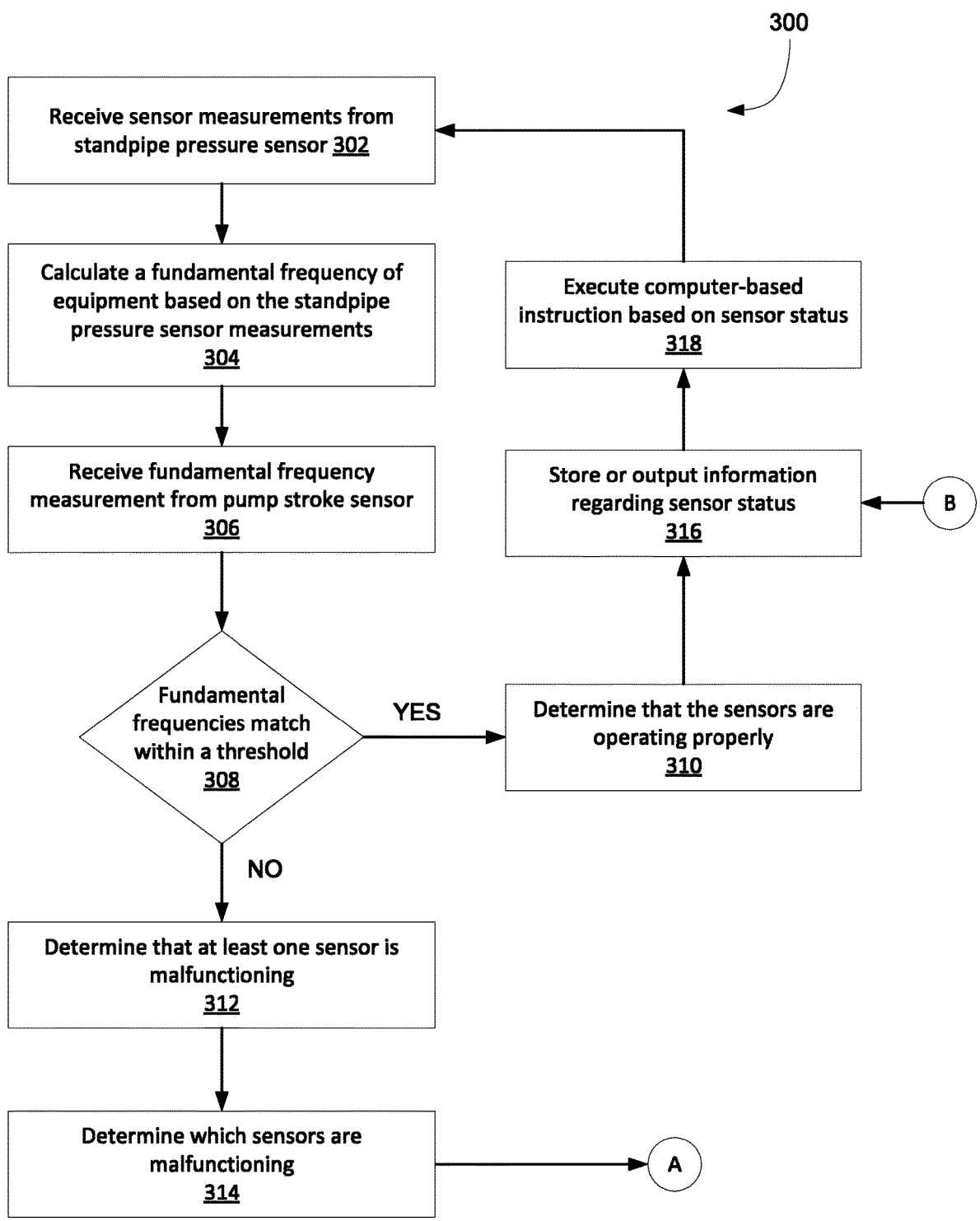
FIG. 3 illustrates an example flowchart of a process for determining and reporting the operating status of sensors based on independent measurements of the sensors in accordance with aspects of the present disclosure.

FIG. 3 illustrates an example flowchart of a process for determining and reporting the operating status of sensors based on independent measurements of the sensors. The blocks of FIG. 3 may be implemented in the environment of FIG. 2, for example, and are described using reference numbers of elements depicted in FIG. 2. As noted herein, the flowchart illustrates the architecture, functionality, and operation of possible implementations of systems, methods, and computer program products according to various embodiments of the present disclosure.

As shown in FIG. 3, The process 300 may include receiving sensor measurements from a standpipe pressure sensor (as at block 302). For example, the sensor status system 230 may receive sensor measurements from the standpipe pressure sensor 210. More generally, the sensor status system 230 may receive sensor measurements of a first type from a first type of sensor.

The process 300 also may include calculating a fundamental frequency of equipment based on the standpipe pressure sensor measurements (as at block 304). For example, the sensor status system 230 may calculate a fundamental frequency based on the sensor measurements from the standpipe pressure sensor 210. More generally, the standpipe pressure sensor 210 may derive a value for a metric from the sensor measurements (e.g., calculate rather than the metric being directly reported). As one example, the sensor status system 230 may derive a value for the fundamental frequency of equipment from standpipe pressure sensor measurements. In some embodiments, the sensor status system 230 may derive the fundamental frequency based on a power spectrum of the standpipe pressure signal. As an illustrative example, the sensor status system 230 may derive, from standpipe pressure sensor measurements, a value for the fundamental frequency of a crankshaft driving mud pump pistons or plungers.

Figure 4:
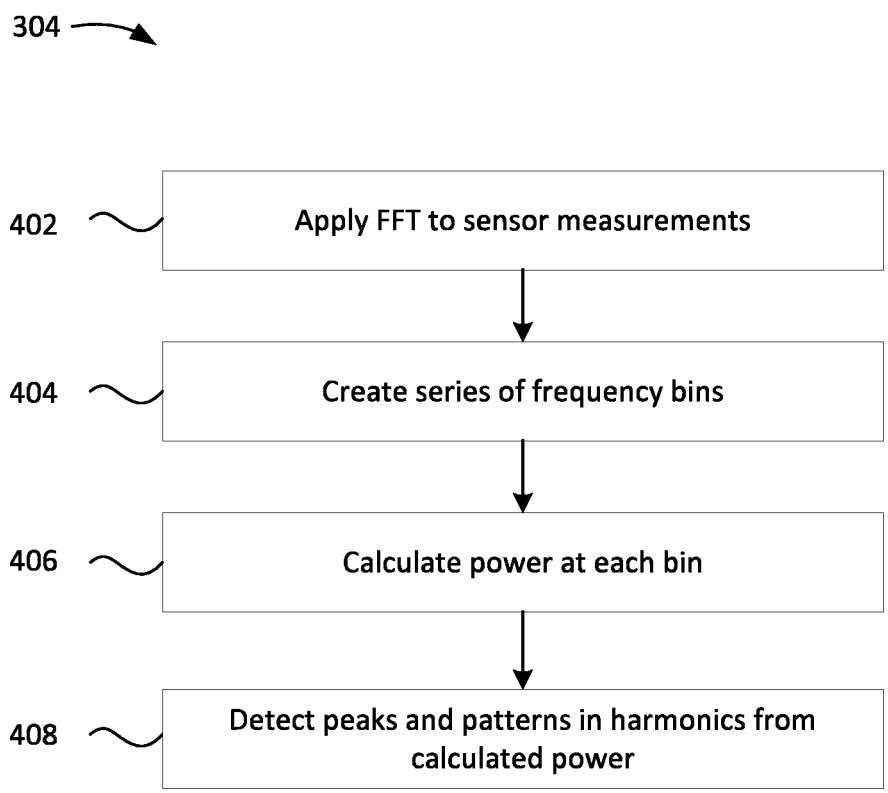
FIG. 4 illustrates example sub-process steps for calculating or deriving the fundamental equipment frequency from the standpipe pressure sensor measurements in accordance with aspects of the present disclosure.
Figure 5:
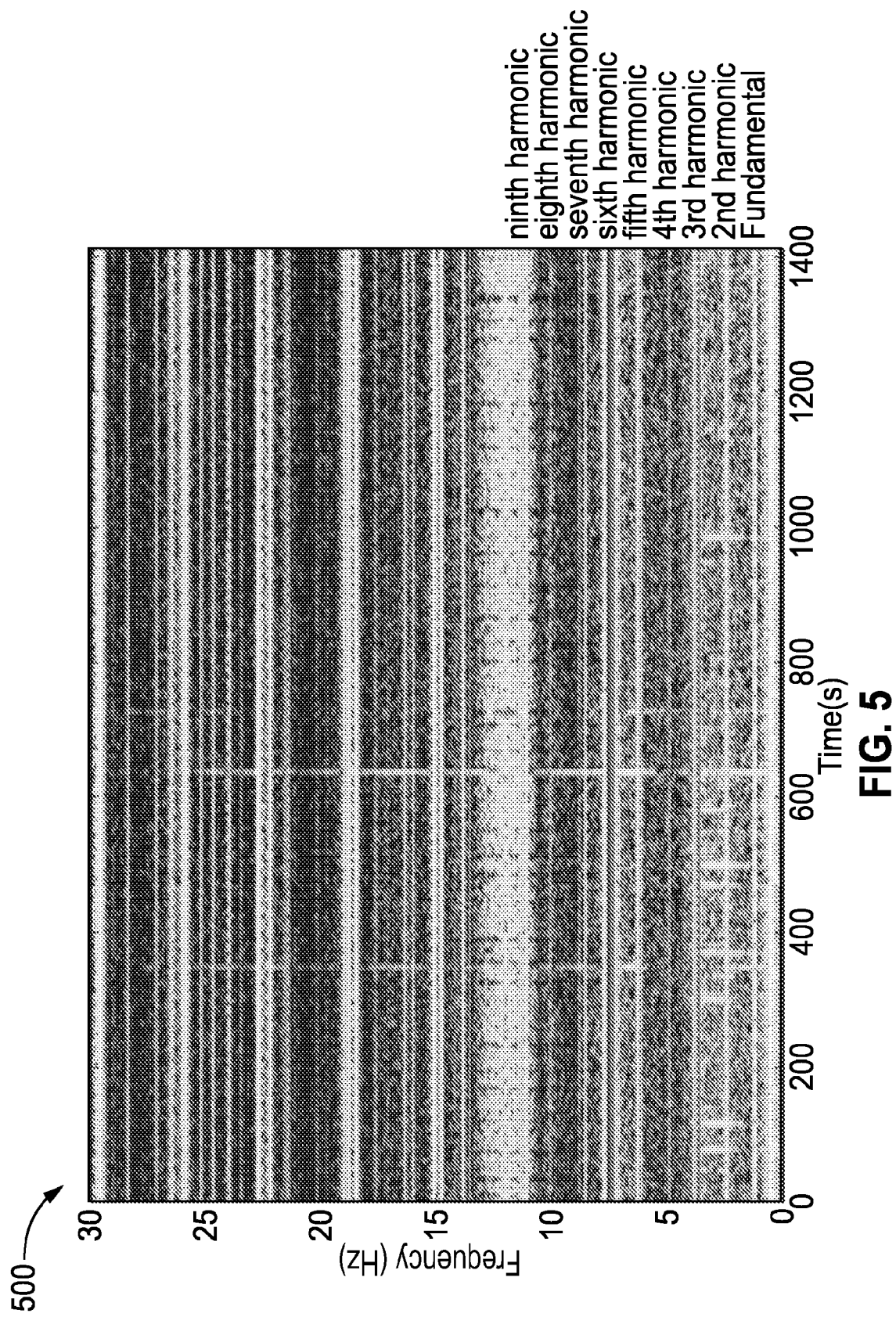
FIG. 5 illustrates an example spectrogram of a power spectrum of a standpipe pressure signal in accordance with aspects of the present disclosure.

FIG. 4 illustrates example sub-process for calculating or deriving the fundamental equipment frequency from the standpipe pressure sensor measurements. For example, the sensor status system 230 may apply a Fast-Fourier Transform (FFT) to the sensor measurements (as at block 402), and more specifically, to the power spectrum of the standpipe pressure signal. In some embodiments, the sensor status system 230 may create a series of frequency bins (as at block 404), calculate power at each bin (as at block 406), and detect peaks and patterns in harmonics from the calculated powers (as at block 408) in which the peaks and patterns represent the fundamental frequency. For example, the sensor status system 230 may detect patterns in the harmonics (e.g., the fundamental harmonic, second harmonic, third harmonic, etc.). An example spectrogram of a power spectrum 500 is shown in FIG. 5, along with the power spectrum and harmonics from which peaks and patterns may be detected.

Returning to FIG. 3, the process 300 further may include receiving fundamental frequency measurement from the pump stroke sensor (as at block 306). For example, the sensor status system 230 may receive fundamental frequency measurement from the pump stroke sensor 220. More generally, the sensor status system 230 may receive sensor measurements of a second type from a second type of sensor in which the sensor measurements include a value for the metric (e.g., fundamental frequency). As one example, the sensor status system 230 may receive a value for the fundamental frequency (e.g., pump stroke frequency) from the pump stroke sensor 220. That is, the pump stroke sensor 220 may provide the fundamental frequency measurement without the sensor status system 230 needing to derive or calculate the fundamental frequency measurement.

The process 300 also may include determining whether the fundamental frequencies match within a threshold (as at block 308). For example, the sensor status system 230 may compare the values of the metrics, such as the fundamental frequencies (e.g., derived at block 304 and received at block 306) and determine whether the fundamental frequencies are within a configurable threshold (e.g., in which the threshold may be selected to balance sensitivity with false alarm frequency). If, for example, fundamental frequencies match within the threshold (block 308-YES), the sensor status system 230 may determine that the sensors are operating properly (as at block 310).

If, on the other hand, the fundamental frequencies do not match within the threshold (block 308-NO), the sensor status system 230 may determine that at least one sensor is malfunctioning (as at block 312). The sensor status system 230 may further determine which sensors are malfunctioning (as at block 314).

Figure 6:
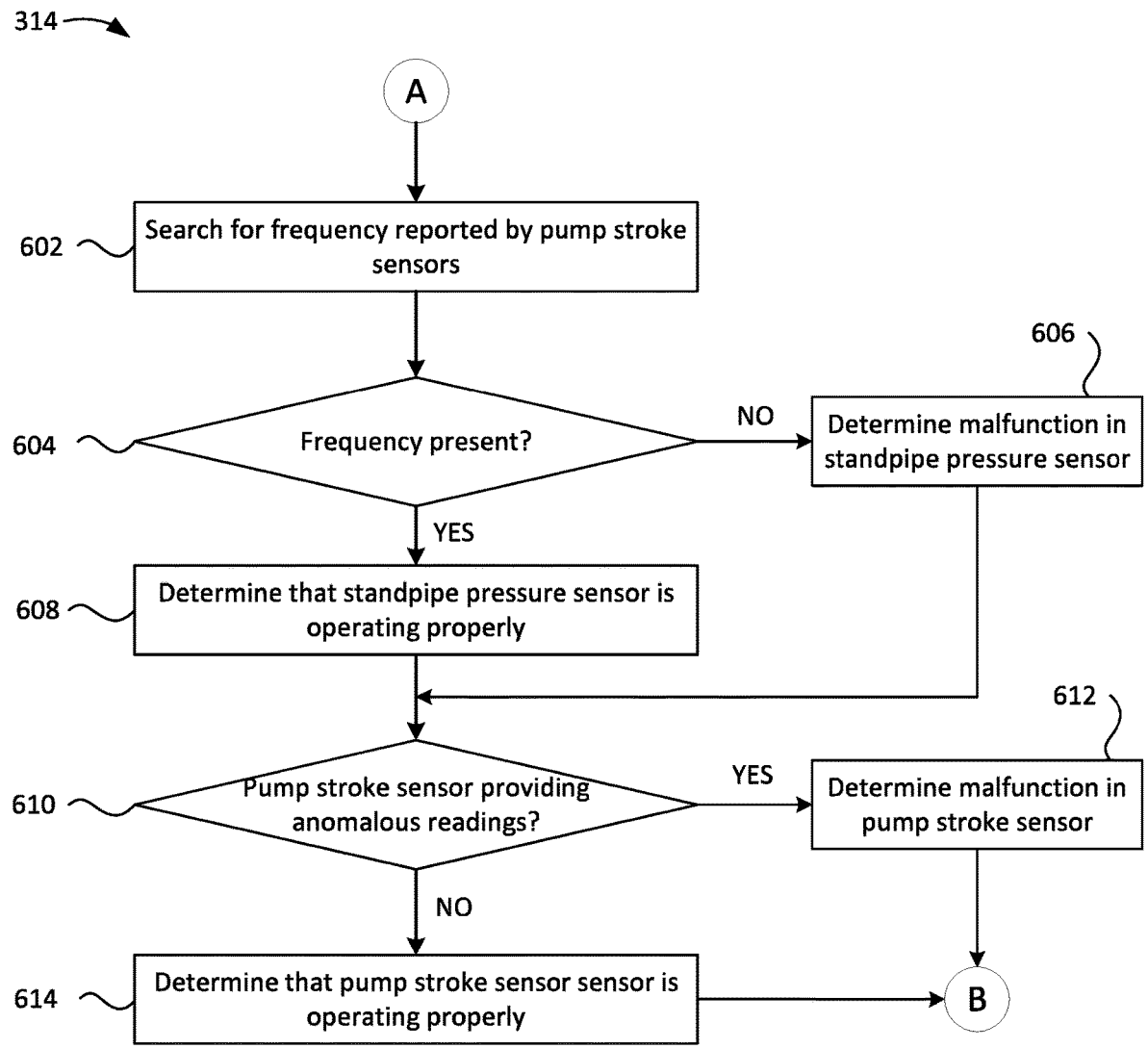
FIG. 6 illustrates a sub-process for determining which sensors are malfunctioning in accordance with aspects of the present disclosure.

FIG. 6 illustrates a sub-process for determining which sensors are malfunctioning. For example, referring to FIG. 6, the sensor status system 230 may search for a frequency reported by the pump stroke sensor (as at block 602). More specifically, the sensor status system 230 may apply an FFT to the sensor measurements from the pump stroke sensor 220 and perform peak detection to determine the frequency reported by the standpipe pressure sensor 210. If the frequency is not present (as at block 604-NO), the sensor status system 230 may determine that the standpipe sensor 210 is malfunctioning (as at block 606). If the frequency is present (as at block 604-YES), the sensor status system 230 may determine that the standpipe pressure sensor is operating properly (as at block 608). In either case, the sensor status system 230 may determine whether the pump stroke sensor 220 is reporting anomalous readings (as at block 610) (e.g., the same pump stroke count over a period of time, excessively high stroke counts, excessively low stroke counts, etc.). If the pump stroke sensor 220 is providing anomalous readings (as at block 610-YES), the sensor status system 230 may determine that the pump stroke sensor 220 is malfunctioning (as at block 612). If, on the other hand, the sensor status system 230 determines that the pump stroke sensor is not providing anomalous readings (block 610 -NO), the sensor status system 230 may determine that the pump stroke sensor 210 is operating properly (as at block 614). In this way, the sensor status system 230 may determine whether the standpipe pressure sensor 210, the pump stroke sensor 220, or both, are malfunctioning.

The process may return to block 316 shown in FIG. 3 in which the sensor status system 230 may store or output information regarding sensor status (as block 316). For example, the sensor status system 230 may determine that either the standpipe pressure sensor 210 and the pump stroke sensor 220 are both functioning properly (e.g., as previously discussed with respect to block 310), or that one or both of the standpipe pressure sensor 210 and the pump stroke sensor 220 are malfunctioning (as discusses with respect to blocks 312 and 314). In either situation, the sensor status system 230 may store or output the sensor status information for display.

The process 300 further may include executing a computer-based instruction based on the sensor status (as at block 318). For example, the sensor status system 230 may execute an instruction to output an alert based on detecting that one or more of the standpipe pressure sensors 210 and the pump stroke sensor 220 is malfunctioning. In some embodiments, the alert may identify which sensor(s) is/are malfunctioning. Additionally, or alternatively, the sensor status system 230 may execute an instruction to modify equipment operation, modify a service schedule to replace or service one or more malfunction sensors, place an order to replace a malfunction sensor, update a workflow, update a status report, etc. In some embodiments, system 230 may execute an instruction to discontinue transmitting data from the standpipe pressure sensor 210 and/or the pump stroke sensor 220 to another system (e.g., a telemetry system) to prevent contamination of the telemetry system. In this way, only validated, accurate sensor data may be provided, thus enhancing mud pump noise cancellation in the telemetry signal, improving survey quality, and reducing bad data from false telemetry signal detection.

As described herein, accurate pump stroke frequency may enhance mud pump noise cancellation in a telemetry signal, improve survey quality, and reduce inaccurate data from false telemetry signal detection. In demodulation of downhole telemetry information, the operation of mud pumps may contribute to signal interference. Knowledge of the pump stroke frequency may be input into certain noise cancellation algorithms. Inaccurate pump stroke frequency information may disrupt a noise cancellation algorithm and in turn, degrade signal quality. By using two sources to confirm the quality of the sensor measurements, as described herein, incorrect inputs, malfunctioning sensors may be identified early on to prevent erroneous data from being fed to noise cancellation algorithms.

Also, accurate pump stroke measurements aid in the detection of the transition from the mud pumps from powered on to off and vice versa. In some measurement systems, while drilling, a survey may be taken when the mud pumps are turned off, but the survey results are not transmitted from the downhole sensors to the surface until the mud pumps are restored. The surface demodulation system thus detects when the pumps are turned off in order to determine the exact time (and thus bit depth) in which the survey was taken. Accordingly, aspects of the present disclosure improve the detection of malfunctioning sensors, thus improving the detection of when pumps are turned off.

The systems and/or techniques, described herein, may be used to verify the functionality of a standpipe pressure sensor and a pump stroke sensor based on independent measurements from the two sensors. It is noted, however, that the techniques described herein are not so limited. As another example, the functionality of a torque sensor and a rotations per minute (RPM) sensor may be verified using independent measurements acquired by the torque sensor and RPM sensor. As one example, RPM measurements may be derived from torque sensor readings, and compared with RPM measurements reported by the RPM sensor. Additionally, or alternatively, torque measurements may be derived from RPM sensor readings and compared with torque sensor measurements reported by the torque sensor. If the values agree (to within a threshold value), the sensor status system 230 may determine that both sensors are functioning properly. If, on the other hand, the values do not agree, the sensor status system 230 may determine that one or both sensors are malfunctioning, output an alert, and/or determine which of the sensors is malfunctioning. In some embodiments, the techniques described herein may be used to verify the functionality of more than two sensors taking independent measurements.

Figure 7:
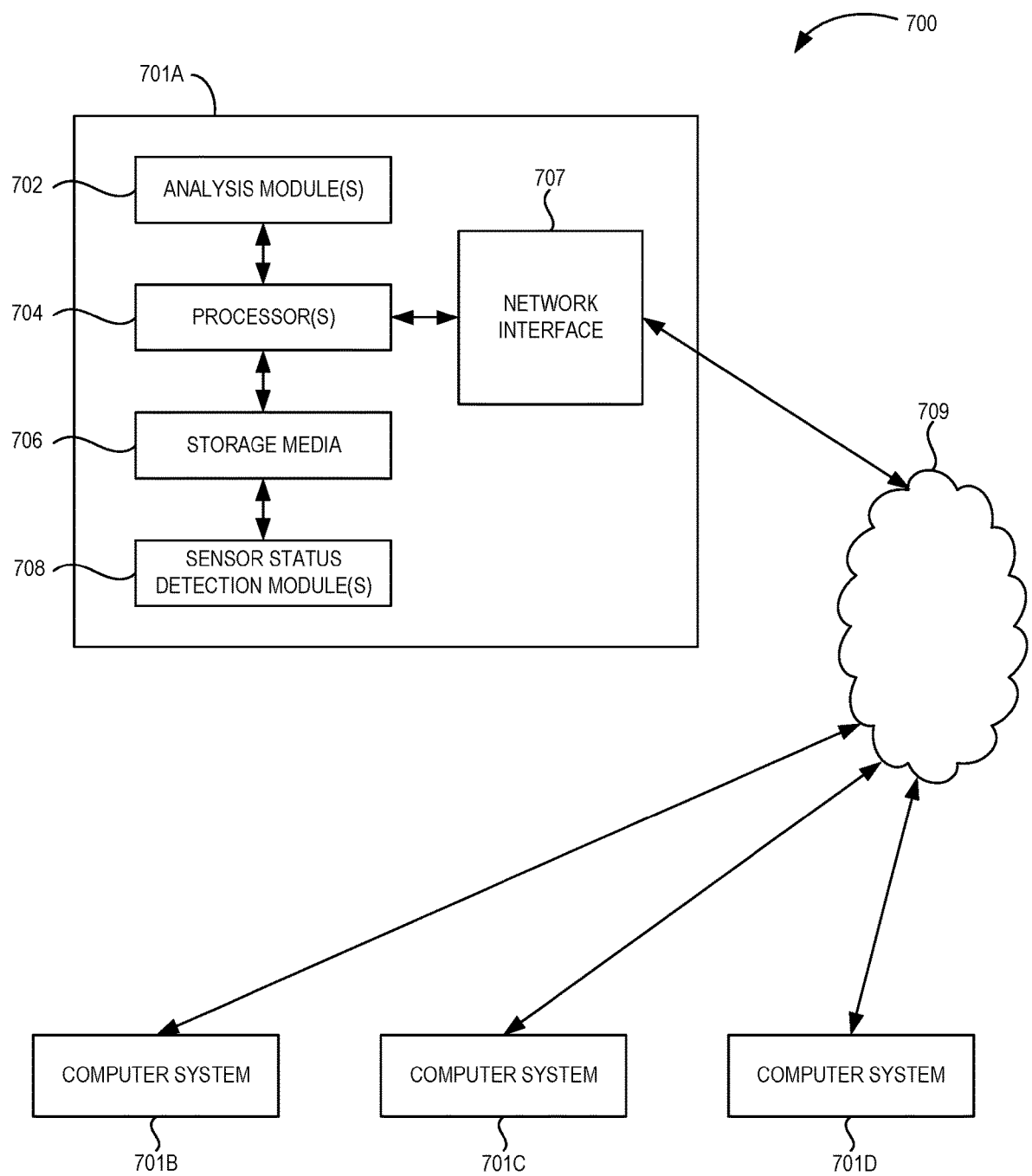
FIG. 7 illustrates a schematic view of a computing system, according to an embodiment.

In some embodiments, the methods of the present disclosure may be executed by a computing system. FIG. 7 illustrates an example of such a computing system 700, in accordance with some embodiments. The computing system 700 may include a computer or computer system 701A, which may be an individual computer system 701A or an arrangement of distributed computer systems. The computer system 701A includes one or more analysis modules 702 that are configured to perform various tasks according to some embodiments, such as one or more methods disclosed herein. To perform these various tasks, the analysis module 702 executes independently, or in coordination with, one or more processors 704, which is (or are) connected to one or more storage media 706. The processor(s) 704 is (or are) also connected to a network interface 707 to allow the computer system 701A to communicate over a data network 709 with one or more additional computer systems and/or computing systems, such as 701B, 701C, and/or 701D (note that computer systems 701B, 701C and/or 701D may or may not share the same architecture as computer system 701A, and may be located in different physical locations, e.g., computer systems 701A and 701B may be located in a processing facility, while in communication with one or more computer systems such as 701C and/or 701D that are located in one or more data centers, and/or located in varying countries on different continents).

A processor may include a microprocessor, microcontroller, processor module or subsystem, programmable integrated circuit, programmable gate array, or another control or computing device.

The storage media 706 may be implemented as one or more computer-readable or machine-readable storage media. Note that while in the example embodiment of FIG. 7 storage media 706 is depicted as within computer system 701A, in some embodiments, storage media 706 may be distributed within and/or across multiple internal and/or external enclosures of computing system 701A and/or additional computing systems. Storage media 706 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 700 contains one or more sensor status detection module(s) 708. In the example of computing system 700, computer system 701A includes the sensor status detection module 708. In some embodiments, a single sensor status detection 708 may be used to perform some aspects of one or more embodiments of the methods disclosed herein. In other embodiments, a plurality of sensor status detection modules 708 may be used to perform some aspects of methods herein.

It should be appreciated that computing system 700 is merely one example of a computing system, and that computing system 700 may have more or fewer components than shown, may combine additional components not depicted in the example embodiment of FIG. 7, and/or computing system 700 may have a different configuration or arrangement of the components depicted in FIG. 7. The various components shown in FIG. 7 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of the present disclosure.

Computational interpretations, models, and/or other interpretation aids may be refined in an iterative fashion; this concept is applicable to the methods discussed herein. This may include use of feedback loops executed on an algorithmic basis, such as at a computing device (e.g., computing system 700, FIG. 7), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or limiting to the precise forms disclosed. Many modifications and variations are possible in view of the above teachings. Moreover, the order in which the elements of the methods described herein are illustrate and described may be re-arranged, and/or two or more elements may occur simultaneously. The embodiments were chosen and described in order to best explain the principles of the disclosure and its practical applications, to thereby enable others skilled in the art to best utilize the disclosed embodiments and various embodiments with various modifications as are suited to the particular use contemplated.

What is claimed is:

1. A method for detecting sensor malfunctioning status, comprising:
   receiving sensor measurements of a first type from a first type of sensor;
   deriving a first frequency associated with equipment that corresponds to the first type of sensor based on the sensor measurements of the first type and a first transformation algorithm;
   receiving sensor measurements of a second type from a second type of sensor different than the first type of sensor associated with the equipment that corresponds to the first type of sensor and the second type of sensor, wherein the sensor measurements of the second type include a second frequency;
   determining whether the first type of sensor or the second type of sensor is malfunctioning based on the first frequency being outside a threshold range with respect to the second frequency;
   in response to determining that the first frequency is outside the threshold range with respect to the second frequency, determining that the first type of sensor is operating properly by:
      deriving a third frequency based on the sensor measurements of the second type and a second transformation algorithm different from the first transformation algorithm; and
      detecting that the first frequency is present in the third frequency; and
   storing or outputting information representing the first type of sensor is operating properly.

2. The method of claim 1, wherein the first frequency includes a fundamental frequency of oil and gas-related equipment.

3. The method of claim 1, wherein the deriving the first frequency comprises transforming the sensor measurements of the first type from the first type of sensor to a power spectrum of the sensor measurements of the first type via the first transformation algorithm, the sensor measurements of the first type comprising a pressure signal from the first type of sensor.

4. The method of claim 1, further comprising determining whether the first type of sensor or the second type of sensor is operating properly based on whether the first frequency and the second frequency match to within the threshold range.

5. The method of claim 1, wherein the first type of sensor is a standpipe sensor and the second type of sensor is a pump stroke sensor.

6. The method of claim 1, wherein the sensor measurements of the first type include standpipe pressure sensor measurements and the sensor measurements of the second type include pump stroke measurements of a mud pump.

7. The method of claim 1, further comprising executing a computer-based instruction based on the determining whether the first type of sensor or the second type of sensor is malfunctioning, wherein the computer-based instruction includes at least one selected from the group consisting of:
   an instruction to output an alert identifying a malfunction of the first type of sensor or the second type of sensor;
   an instruction to modify equipment operation;
   an instruction to modify a service schedule for sensor repair or replacement;
   an instruction to place an order for the first type of sensor or the second type of sensor;
   an instruction to update a workflow;
   an instruction to discontinue transmitting data from the first type of sensor or the second type of sensor to a telemetry system to prevent contamination of the telemetry system; and
   an instruction to update a status report.

8. A computing system, comprising:
   one or more processors; and
   a memory system comprising one or more non-transitory computer-readable media storing instructions that, when executed by at least one of the one or more processors, cause the computing system to perform operations, the operations comprising:
      receiving sensor measurements of a first type from a first type of sensor;
      deriving a first frequency associated with equipment that corresponds to the first type of sensor based on the sensor measurements of the first type and a first transformation algorithm;
      receiving sensor measurements of a second type from a second type of sensor different than the first type of sensor associated with the equipment that corresponds to the first type of sensor and the second type of sensor, wherein the sensor measurements of the second type include a second frequency;
      determining whether the first type of sensor or the second type of sensor is malfunctioning based on the first frequency being outside a threshold range with respect to the second frequency;
      in response to determining that the first frequency is outside the threshold range with respect to the second frequency, determining that the first type of sensor is operating properly by:
         deriving a third frequency based on the sensor measurements of the second type and a second transformation algorithm different from the first transformation algorithm; and
         detecting that the first frequency is present in the third frequency; and
      storing or outputting information representing the first type of sensor is operating properly.

9. The computing system of claim 8, wherein the first frequency includes a fundamental frequency of oil and gas-related equipment.

10. The computing system of claim 8, wherein the deriving the first frequency comprises transforming the sensor measurements of the first type from the first type of sensor to a power spectrum of the sensor measurements of the first type via the first transformation algorithm, the sensor measurements of the first type comprising a pressure signal from the first type of sensor.

11. The computing system of claim 8, further comprising determining whether the first type of sensor or the second type of sensor is operating properly based on whether the first frequency and the second frequency match to within the threshold range.

12. The computing system of claim 8, wherein the first type of sensor is a standpipe sensor and the second type of sensor is a pump stroke sensor.

13. The computing system of claim 8, wherein the sensor measurements of the first type include standpipe pressure sensor measurements and the sensor measurements of the second type include pump stroke measurements of a mud pump.

14. The computing system of claim 8, further comprising executing a computer-based instruction based on the determining whether the first type of sensor or the second type of sensor is malfunctioning, wherein the computer-based instruction includes at least one selected from the group consisting of:
   an instruction to output an alert identifying a malfunction of the first type of sensor or the second type of sensor;
   an instruction to modify equipment operation;
   an instruction to modify a service schedule for sensor repair or replacement;
   an instruction to place an order for the first type of sensor or the second type of sensor;
   an instruction to update a workflow;
   an instruction to discontinue transmitting data from the first type of sensor or the second type of sensor to a telemetry system to prevent contamination of the telemetry system; and
   an instruction to update a status report.

15. A non-transitory computer-readable medium storing instructions that, when executed by one or more processors of a computing system, cause the computing system to perform operations, the operations comprising:
   receiving sensor measurements of a first type from a first type of sensor;
   deriving a first frequency associated with equipment that corresponds to the first type of sensor based on the sensor measurements of the first type and a first transformation algorithm;
   receiving sensor measurements of a second type from a second type of sensor different than the first type of sensor associated with the equipment that corresponds to the first type of sensor and the second type of sensor, wherein the sensor measurements of the second type include a second frequency;
   determining whether the first type of sensor or the second type of sensor is malfunctioning based on the first frequency being outside a threshold range with respect to the second frequency;
   in response to determining that the first frequency is outside the threshold range with respect to the second frequency, determining that the first type of sensor is operating properly by:
      deriving a third frequency based on the sensor measurements of the second type and a second transformation algorithm different from the first transformation algorithm; and
      detecting that the first frequency is present in the third frequency; and
   storing or outputting information indicating the first type of sensor is operating properly.

16. The computer-readable medium of claim 15, wherein the first frequency includes a fundamental frequency of oil and gas-related equipment.

17. The computer-readable medium of claim 15, wherein the deriving the first frequency comprises transforming the sensor measurements of the first type from the first type of sensor to a power spectrum of the sensor measurements via the first transformation algorithm, the sensor measurements of the first type comprising a pressure signal from the first type of sensor.

18. The computer-readable medium of claim 15, further comprising determining whether the first type of sensor or the second type of sensor is operating properly based on whether the first frequency and the second frequency match to within the threshold range.

19. The computer-readable medium of claim 15, wherein the first type of sensor is a standpipe sensor and the second type of sensor is a pump stroke sensor.

20. The computer-readable medium of claim 15, wherein the sensor measurements of the first type include standpipe pressure sensor measurements and the sensor measurements of the second type include pump stroke measurements of a mud pump.

* * * * *